United States Patent
Fujiyoshi et al.

(10) Patent No.: US 11,511,605 B2
(45) Date of Patent: Nov. 29, 2022

(54) OPERATION INPUT DEVICE AND DOOR HANDLE

(71) Applicant: ALPS ALPINE CO., LTD., Tokyo (JP)

(72) Inventors: Tatsumi Fujiyoshi, Miyagi (JP); Hiroshi Shigetaka, Miyagi (JP); Daisuke Takai, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 391 days.

(21) Appl. No.: 16/818,101

(22) Filed: Mar. 13, 2020

(65) Prior Publication Data

US 2020/0207189 A1 Jul. 2, 2020

Related U.S. Application Data

(63) Continuation of application No. PCT/JP2018/027648, filed on Jul. 24, 2018.

(30) Foreign Application Priority Data

Sep. 29, 2017 (JP) .............................. JP2017-191201

(51) Int. Cl.
*B60J 5/04* (2006.01)
*E05B 81/76* (2014.01)
(Continued)

(52) U.S. Cl.
CPC ............... *B60J 5/04* (2013.01); *E05B 81/77* (2013.01); *E05B 81/78* (2013.01); *G01B 7/001* (2013.01); *G06F 3/044* (2013.01); *G06F 3/0416* (2013.01)

(58) Field of Classification Search
None
See application file for complete search history.

(56) References Cited

U.S. PATENT DOCUMENTS

| 4,680,430 A | * | 7/1987 | Yoshikawa | ............. G06F 3/045 345/174 |
| 2011/0181387 A1 | | 7/2011 | Popelard | |

(Continued)

FOREIGN PATENT DOCUMENTS

| EP | 2546728 | 1/2013 |
| JP | S60-181915 | 9/1985 |

(Continued)

OTHER PUBLICATIONS

Extended European Search Report for 18862686.5 dated May 20, 2021.

(Continued)

*Primary Examiner* — K. Wong
(74) *Attorney, Agent, or Firm* — IPUSA, PLLC

(57) ABSTRACT

An operation input device includes a resistance element to generate a capacitance between an operating medium and the resistance element in response to an approach of the operating medium to the resistance element, and a power source to supply electric charge to one end and the other end of the resistance element. A first electric unit measures a first electric charge transfer amount supplied to the one end of the resistance element in response to generation of the capacitance. A second unit measures a second electric charge transfer amount supplied to the other end of the resistance element in response to generation of the capacitance. A controller is connected to the first and second units, and detects a position of the operating medium in a direction perpendicular to a surface of the resistance element based on a sum of the first and second electric charge transfer amounts.

8 Claims, 15 Drawing Sheets

(51) Int. Cl.
    *E05B 81/78*     (2014.01)
    *G01B 7/00*     (2006.01)
    *G06F 3/041*     (2006.01)
    *G06F 3/044*     (2006.01)

(56) References Cited

U.S. PATENT DOCUMENTS

| | | |
|---|---|---|
| 2013/0120257 A1 | 5/2013 | Park et al. |
| 2016/0277023 A1* | 9/2016 | Nakajima .......... H03K 17/9625 |
| 2017/0152687 A1* | 6/2017 | Koizumi ................. E05B 81/62 |

FOREIGN PATENT DOCUMENTS

| | | |
|---|---|---|
| JP | S60-254312 | 12/1985 |
| JP | 2009-079353 | 4/2009 |
| JP | 2010-090629 | 4/2010 |
| JP | 2013-533568 | 8/2013 |
| WO | 8001762 | 9/1980 |
| WO | 2013/153609 | 10/2013 |

OTHER PUBLICATIONS

International Search Report for PCT/JP2018/027648 dated Sep. 4, 2018.

\* cited by examiner

Ia AND Ib HARDLY FLOW

OPERATION INPUT DEVICE AND DOOR HANDLE

CROSS-REFERENCE TO RELATED APPLICATION

The present application is a continuation application of International Application No. PCT/JP2018/027648 filed on Jul. 24, 2018 and designated the U.S., which is based on and claims priority to Japanese Patent Application No. 2017-191201 filed with the Japanese Patent Office on Sep. 29, 2017, the entire contents of which are hereby incorporated by reference.

BACKGROUND OF THE INVENTION

1. Field of the Invention

The present invention relates to an operation input device and a door handle.

2. Description of the Related Art

On the door of a car, a door handle for opening and closing the door is provided on the outside of the car. A vehicle door opening/closing control device is disclosed (for example, Patent Document 1) that enables operation of the door of a car and the like without touching the door handle.

In such a vehicle door opening/closing control device, the operation such as opening/closing the door can be performed by touching the door handle and the like with a hand and moving the touching hand.

However, in the above-described vehicle door opening/closing control device, the door handle and the like reliably need to be touched with the hand, and the operation range is limited. In addition, when a variety of pieces of operation information is intended to be input, the vehicle door opening/closing control device is likely to be large in size, and the structure is likely to be complicate, thereby increasing a cost.

For this reason, there is a need for an operation input device having a simple structure and capable of inputting a variety of pieces of operation information without limiting a range of operation a lot.

PRIOR ART DOCUMENTS

Patent Documents

Patent Document 1: Japanese Laid-Open Patent Application Publication No. 2009-79353
Patent Document 2: Japanese Laid-Open Patent Application Publication No. S60-254312

SUMMARY OF THE INVENTION

According to one embodiment of the present embodiment, there is provided an operation input device that includes a resistance element configured to generate a capacitance between an operating medium and the resistance element in response to an approach of the operating medium to the resistance element, and a power source configured to supply electric charge to one end and the other end of the resistance element. A first electric charge amount measuring unit is configured to measure a first electric charge transfer amount supplied to the one end of the resistance element in response to generation of the capacitance. A second electric charge amount measuring unit configured to measure a second electric charge transfer amount supplied to the other end of the resistance element in response to the generation of the capacitance. A controller is connected to the first electric charge amount measuring unit and the second electric charge amount measuring unit and is configured to detect a first position of the operating medium in a direction perpendicular to a surface of the resistance element based on a sum of the first and second electric charge transfer amounts.

EMBODIMENTS FOR CARRYING OUT THE INVENTION

Figure 1:
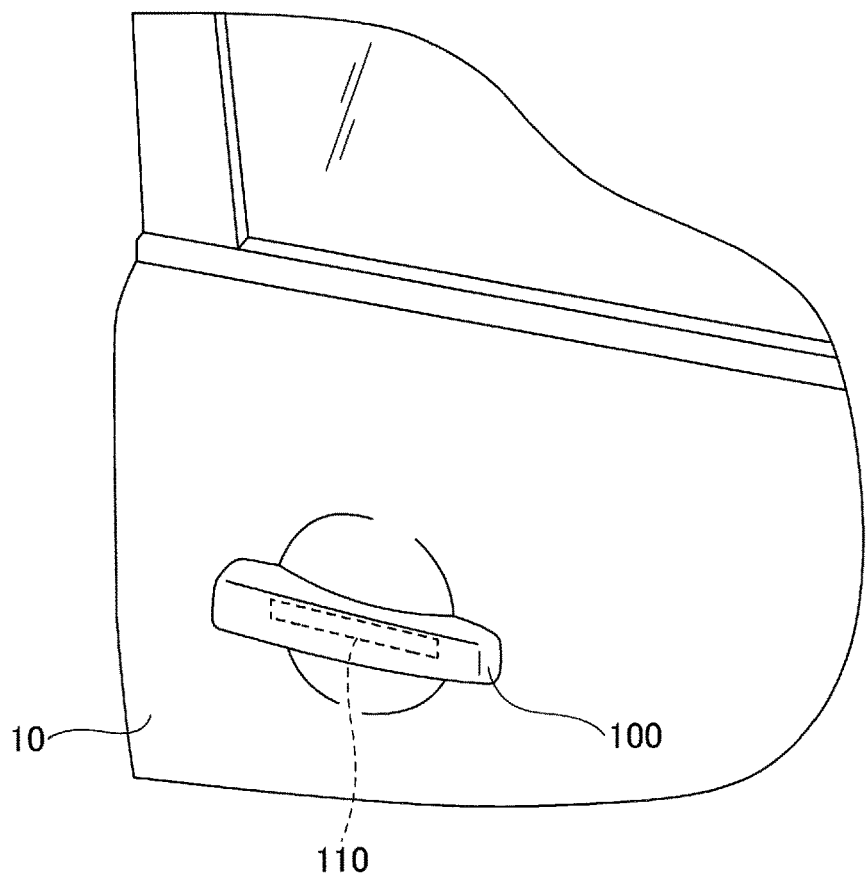
FIG. 1 is an explanation drawing of a door with a door handle in a first embodiment.

An embodiment for carrying out is described below. The description of the same member and the like will be omitted by putting the same reference numerals.

First Embodiment

An operation input device according to a first embodiment will be described. The operation input device according to the present embodiment is built in a door handle attached to a door of a car and the like, and has a function to input operation information.

Figure 2:
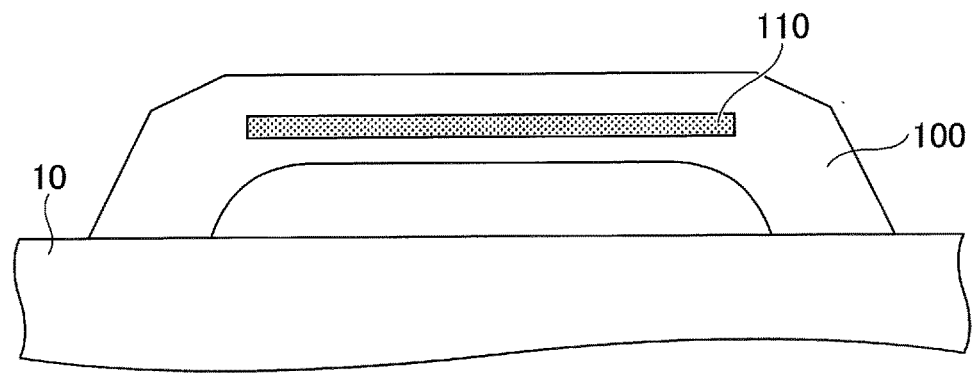
FIG. 2 is an explanation drawing of a door handle according to a first embodiment.

Specifically, the operation input device according to the present embodiment is a door handle 100 attached to a door 10, such as a car, as shown in FIG. 1. A sensor 110 for detecting capacitance is inside the door handle 100, as shown in FIG. 2. The sensor 110 is a generally rectangular shaped resistance element, and the length of the sensor 110 in the longitudinal direction is L. The resistance between one end 110*a* and the other end 110*b* in the longitudinal direction is preferably 5 kΩ or more and 300 kΩ or less. In the present embodiment, the longitudinal direction parallel to the plane direction of the sensor 110 is sometimes expressed as an X direction, and the direction perpendicular to the plane of the sensor 110, that is, the direction perpendicular to the longitudinal direction of the sensor 110 is sometimes expressed as a Y direction.

Figure 3:
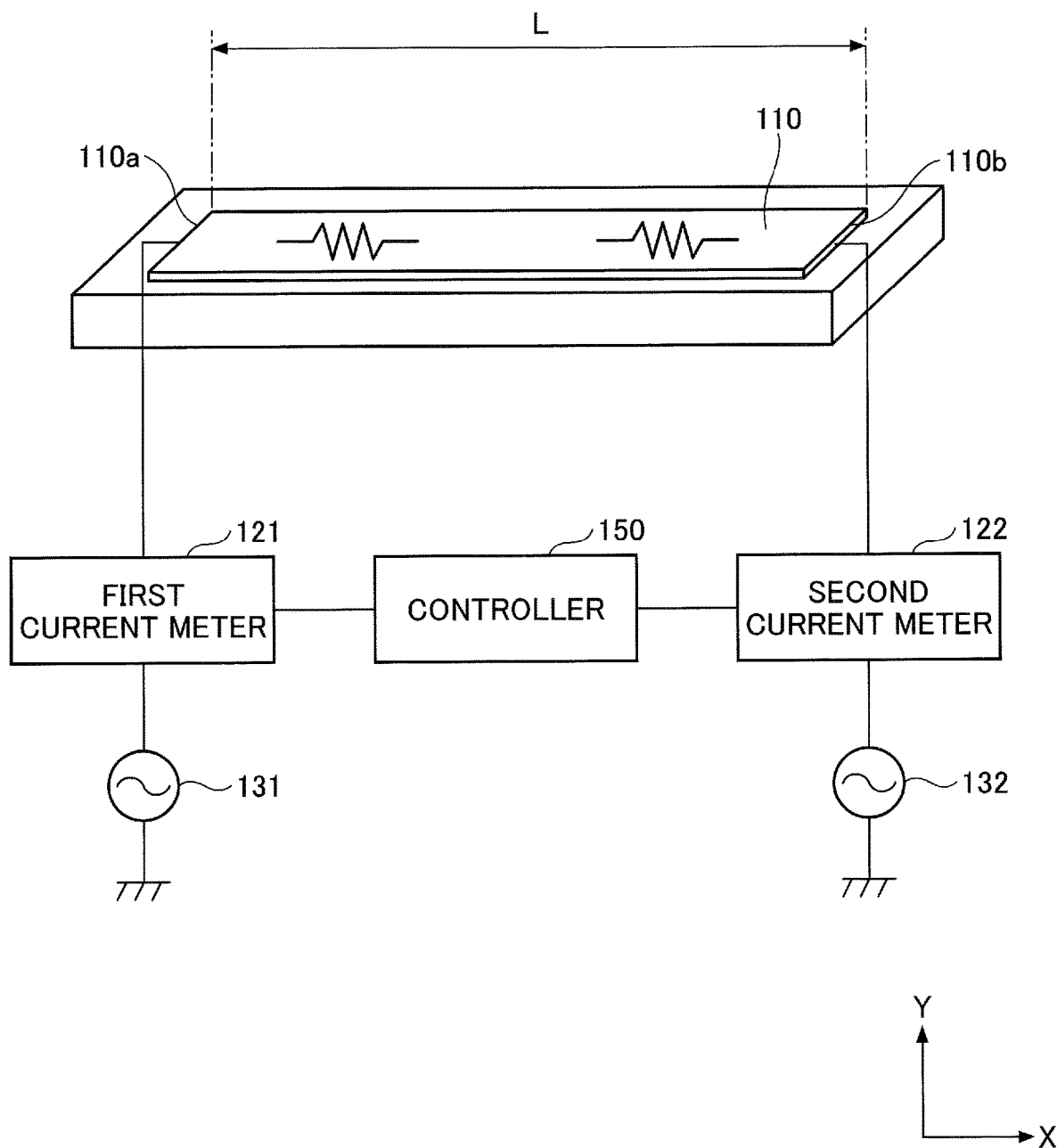
FIG. 3 is a structural diagram of an operation input device according to a first embodiment.

In the present embodiment, as shown in FIG. 3, a first AC power source 131 is connected to one end 110*a* of the sensor 110 via a first current meter 121. That is, the first current meter 121 is connected between one end 110*a* of the sensor 110 and the first AC power source 131. Also, a second AC power source 132 is connected to the other end 110*b* of the sensor 110 via a second current meter 122. That is, the second current meter 122 is connected between the other end 110*b* of the sensor 110 and the second AC power source 132. The first current meter 121 and the second current meter 122 are connected to a controller 150. Here, the first AC power source 131 and the second AC power source 132 may be described as a power source, and the first current meter 121 and the second current meter 122 may be described as a first electric charge amount measuring unit and a second electric charge amount measuring unit because the first current meter 121 and the second current meter 122 measure the amount of moving electric charge.

In the door handle 100 of the present embodiment, an AC voltage is applied to one end 110*a* of the sensor 110 from the first AC power source 131, and the amount of AC current supplied to one end 110*a* of the sensor 110 can be measured by the first current meter 121. Alternatively, an AC voltage is applied to the other end 110*b* of the sensor 110 from the second AC power source 132, and the amount of alternating current supplied to the other end 110*b* of the sensor 110 can be measured by the second current meter 122.

Figure 4A:
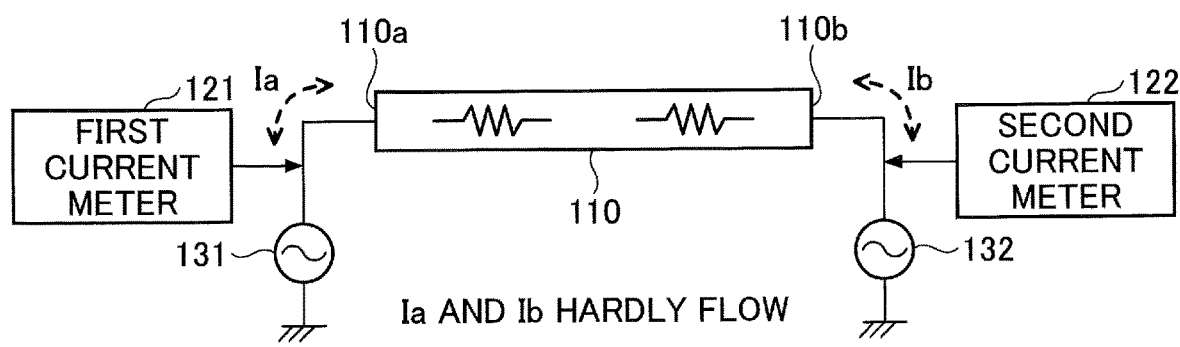
FIG. 4A is an explanation drawing (1) of an operation input device according to a first embodiment.

In the present embodiment, the first AC power source 131 and the second AC power source 132 output AC voltages having the same frequency, the same amplitude, and the same phase. In addition, the first AC power source 131 and the second AC power source 132 can be shared as a single power source. Accordingly, as shown in FIG. 4A, a current hardly flows to one end 110*a* of the sensor 110 and the other end 110*b* of the sensor 110 that are contained in the door handle 100 when there is nothing near the door handle 100. Therefore, no current is detected at the first current meter 121 and the second current meter 122.

Figure 4B:
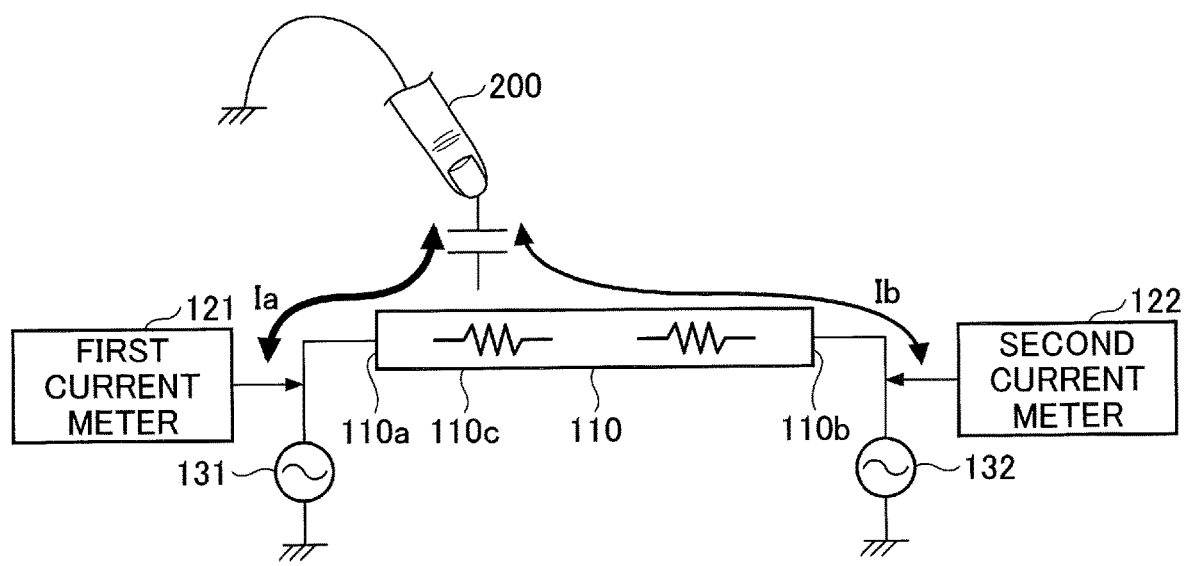
FIG. 4B is an explanation drawing (2) of an operation input device according to a first embodiment.

In contrast, as shown in FIG. 4B, when a finger 200 approaches the door handle 100, because the finger 200 is electrically conductive, a capacitance is generated between the finger 200 and the sensor 110, and currents flow from the first and second AC power sources 131 and 132 to the sensor 110. On this occasion, the portion between the location 110*c* of the sensor 110 closest to the finger 200 and one end 110*a* becomes the resistance, and the portion between the location of the sensor 110 closest to the finger 200 and the other end 110*b* becomes the resistance.

Thus, the alternating current supplied from the first AC power source 131 passes through one end 110*a* of the sensor 110 to the location 110*c* of the sensor 110 closest to the finger 200. Accordingly, the alternating current supplied from the first AC power source 131 passes through the resistance formed between one end 110*a* of the sensor 110 and the location 110*c* of the sensor 110 closest to the finger 200. Also, the alternating current supplied from the second AC power source 132 passes through the other end 110*b* of the sensor 110 to the location 110*c* of the sensor 110 closest to the finger 200. Accordingly, the alternating current supplied from the second AC power source 132 passes through the resistance formed between the other end 110*b* of the sensor 110 and the location 110*c* of the sensor 110 closest to the finger 200. Accordingly, as shown in FIG. 4B, when the finger 200 is brought closer to the sensor 110, an alternating current Ia flows from the first AC power source 131 to one end 110*a* of the sensor 110, and an alternating current Ib flows from the second AC power source 132 to the other end 110*b* of the sensor 110. Because the operation input device according to the present embodiment is operated by the finger 200, the finger 200 may be described as an operating medium.

Figure 5A:
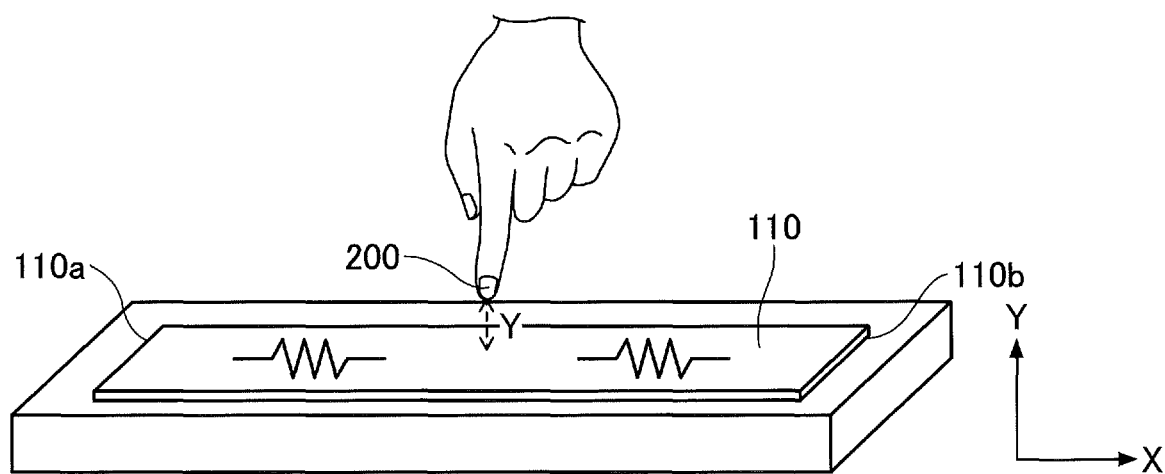
FIG. 5A is an explanation drawing (3) of an operation input device according to a first embodiment.
Figure 5B:
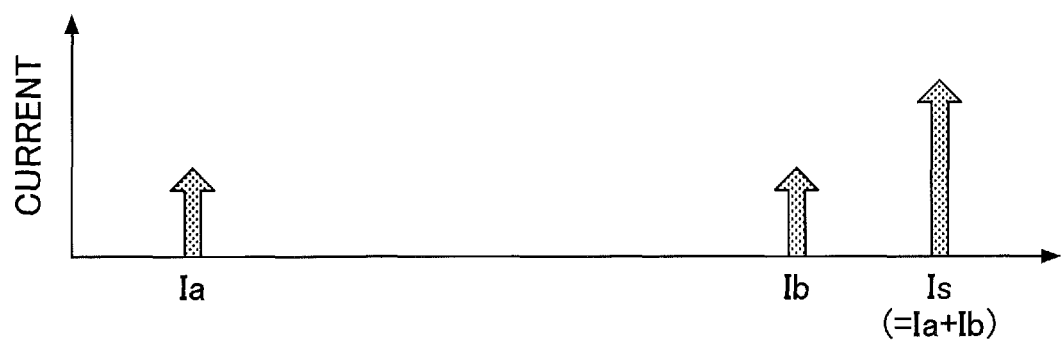
FIG. 5B is an explanation drawing (4) of an operation input device according to a first embodiment.
Figure 6A:
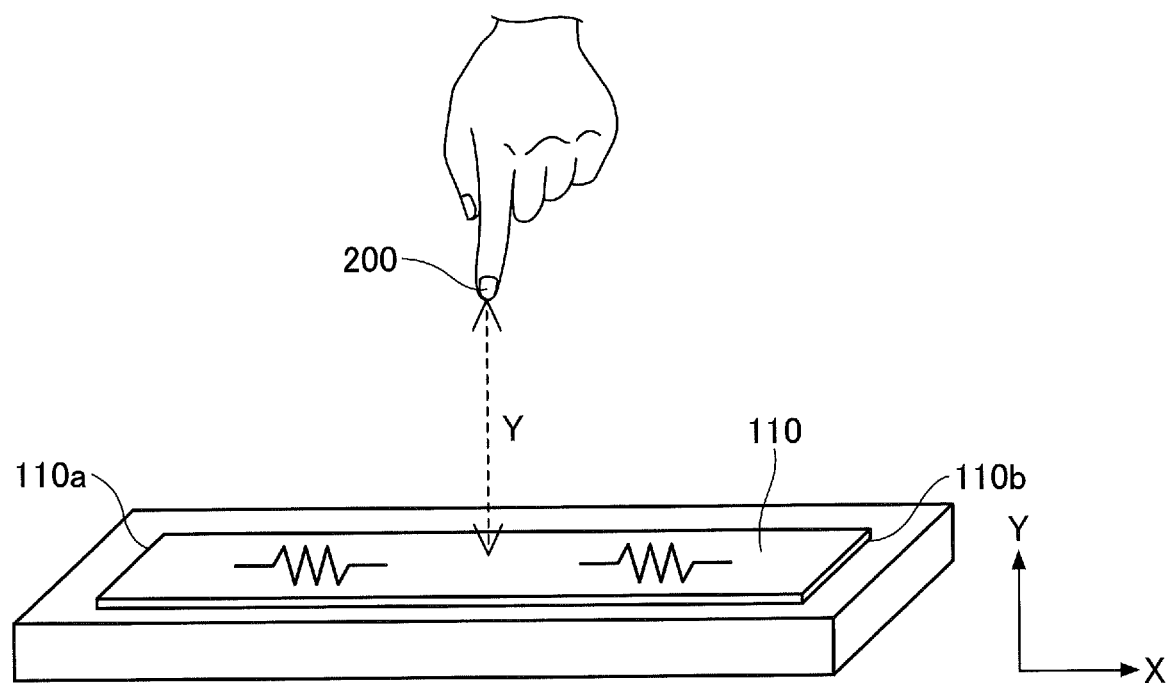
FIG. 6A is an explanation view (5) of an operation input device according to a first embodiment.
Figure 6B:
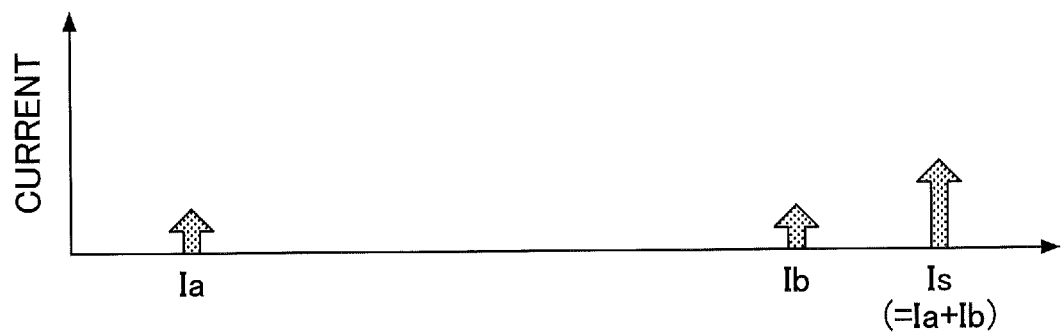
FIG. 6B is an explanation view (6) of an operation input device according to a first embodiment.

Accordingly, as shown in FIG. 5A, because the value of the capacitance formed between the sensor 110 and the finger 200 is great when the distance Y between the sensor 110 and the finger 200 is short, the values of the flowing alternating current Ia and the flowing alternating current Ib are great, and the value of the sum Is (=Ia+Ib) of the alternating currents is also great. FIG. 5B is a diagram showing the values of the alternating current Ia, the alternating current Ib, and the sum Is (=Ia+Ib) of the alternating currents. Further, as shown in FIG. 6A, because the value of the capacitance formed between the sensor 110 and the finger 200 is small when the distance Y between the sensor 110 and the finger 200 is long, the values of the flowing alternating current Ia and the flowing alternating current Ib are small, and the value of the sum Is (=Ia+Ib) of the alternating currents is also small. FIG. 6B is a diagram showing the values of the alternating current Ia, the alternating current Ib, and the sum Is (=Ia+Ib) of the alternating currents.

Thus, the value of the sum of the alternating currents Is (=Ia+Ib) is correlated with the distance Y between the sensor 110 and the finger 200. When the distance Y between the sensor 110 and the finger 200 is long, the sum of the alternating currents is small, and when the distance Y is short, the sum of the alternating currents is great. Specifically, it is noted that the sum Is of the alternating currents is inversely proportional to the power of the distance Y based on knowledge from experience, and the sum Is of the alternating currents and the distance Y between the sensor 110 and the finger 200 have the relationship shown in FIG.

7. Expressed mathematically, the equation is given by Formula 1. A and B are constants.

$$Y = \left(\frac{A}{Is}\right)^{\frac{1}{B}} \quad \text{[Formula 1]}$$

As described above, the distance Y between the sensor 110 and the finger 200 can be calculated from the value of the sum Is of the alternating current Ia measured by the first current meter 121 and the alternating current Ib measured by the second current meter 122.

(Method of Detecting Position of Finger by Operation Input Device)

Figure 7:
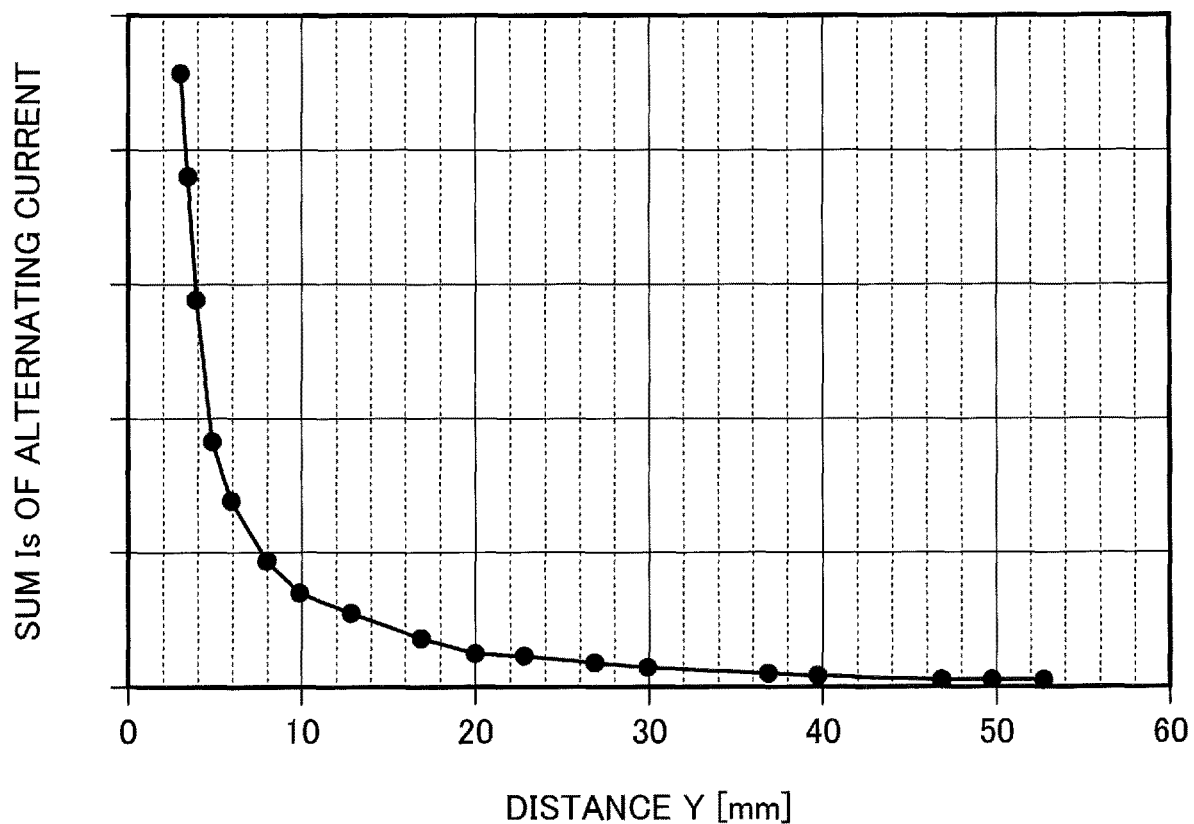
FIG. 7 is a correlation diagram between a distance Y from a sensor and a sum Is of an alternating current.
Figure 8:
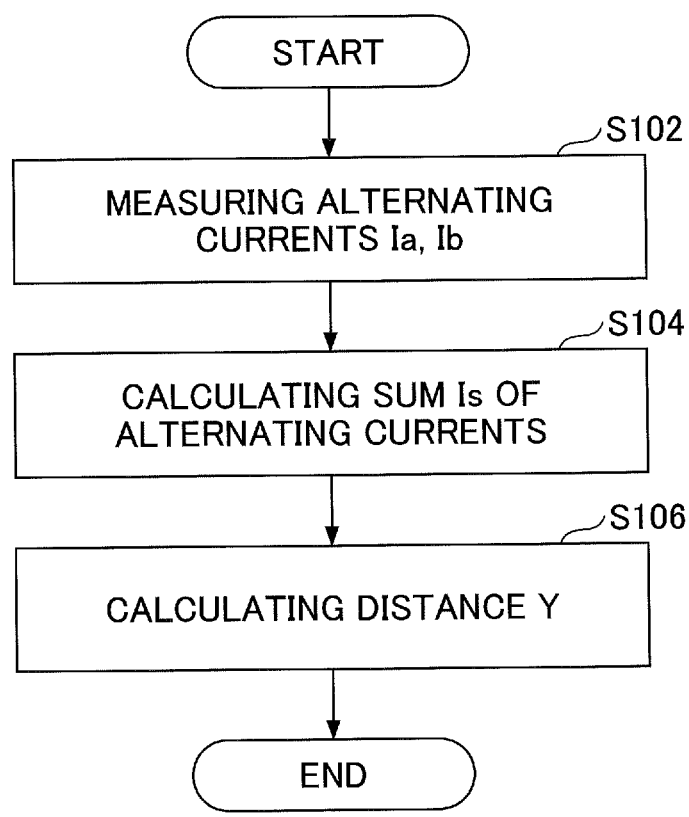
FIG. 8 is a flowchart of position detection by an operation input device according to a first embodiment.

Next, a method for detecting a position of a finger by the operation input device according to the present embodiment will be described with reference to FIG. 8. It is assumed that the equation shown in Formula 1, or information regarding the correlation between the distance Y between the sensor 110 and the finger 200 and the sum Is of the alternating currents as shown in FIG. 7, is previously stored in the controller 150. The following control is performed by the controller 150.

First, in step 102 (S102), the alternating currents Ia, Ib are measured. Specifically, the alternating current Ia is measured by the first current meter 121, and the alternating current Ib is measured by the second current meter 122.

Next, in step 104 (S104), the sum of the alternating current Is (=Ia+Ib) is calculated from the alternating current Ia and the alternating current Ib.

Next, in step 106 (S106), the distance Y from the sensor 110 to the finger 200 is calculated from the sum of the alternating currents Is.

As described above, the position of the finger, that is, the distance Y from the sensor 110 to the finger 200 in the operation input device according to the present embodiment, can be calculated by the operation input device according to the present embodiment.

In the present embodiment, because the area of the sensor 110 is large and because the capacitance between the fingers 200 and the sensor 110 is great, the position of the finger can be detected with high accuracy.

The operation input device according to the present embodiment has a simple structure, and operation information can be input even when the finger 200 is separated from the sensor 110. Accordingly, the operable range of the finger 200 is not so limited, and a variety of pieces of operating information can be input.

Second Embodiment

Next, a second embodiment will be described. In the present embodiment, detection of a gesture by a finger and the like is performed by detecting the position of a finger in the X direction and the Y direction.

As shown in FIG. 4B, the position of the finger 200 with respect to the sensor 110 changes the resistance value between the location 110c of the sensor 110 closest to the finger 200 and one end 110a of the sensor 110 and the resistance value between the location 110c of the sensor 110 closest to the finger 200 and the other end 110b of the sensor 110. Specifically, when the distance between the location 110c of the sensor 110 closest to the finger 200 and one end 110a of the sensor 110 is short, the resistance value is low, and when the distance between the location 110c of the sensor 110 closest to the finger 200 and one end 110a of the sensor 110 is long, the resistance value is high. Similarly, when the distance between the location 110c of the sensor 110 closest to the finger 200 and the other end 110b of the sensor 110 is short, the resistance value is low, and when the distance between the location 110c of the sensor 110 closest to the finger 200 and the other end 110b of the sensor 110 is long, the resistance value is high.

When the same voltage is applied to a resistance element, a more current flows through a resistance element with a lower resistance value than a current that flows through a resistance element with a higher resistance value. Thus, when the position of the finger 200 approaching the sensor 110 is closer to one end 110a than the other end 110b of the sensor 110, the alternating current Ia flows more than the alternating current Ib. Also, when the position is closer to the other end 110b than to one end 110a, the alternating current Ib flows more than the alternating current Ia.

Figure 9A:
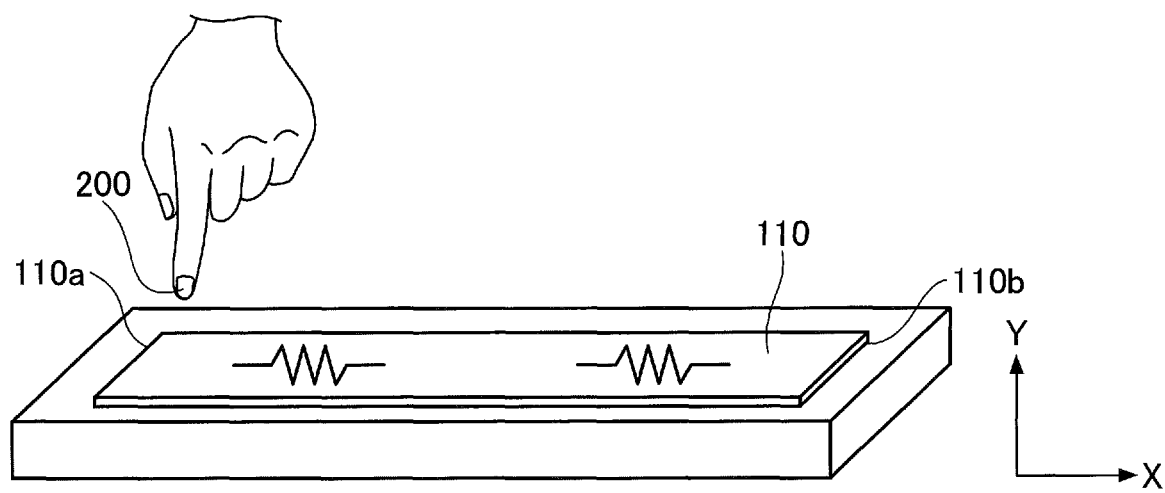
FIG. 9A is an explanation drawing (1) of an operation input device according to a second embodiment.
Figure 9B:
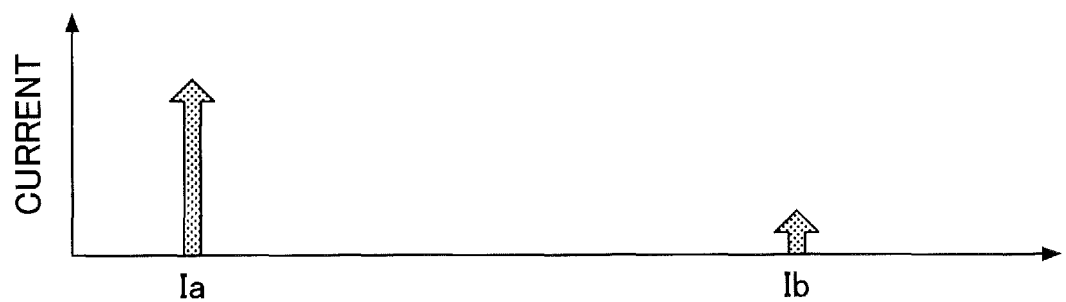
FIG. 9B is an explanation view (2) of an operation input device according to a second embodiment.
Figure 10A:
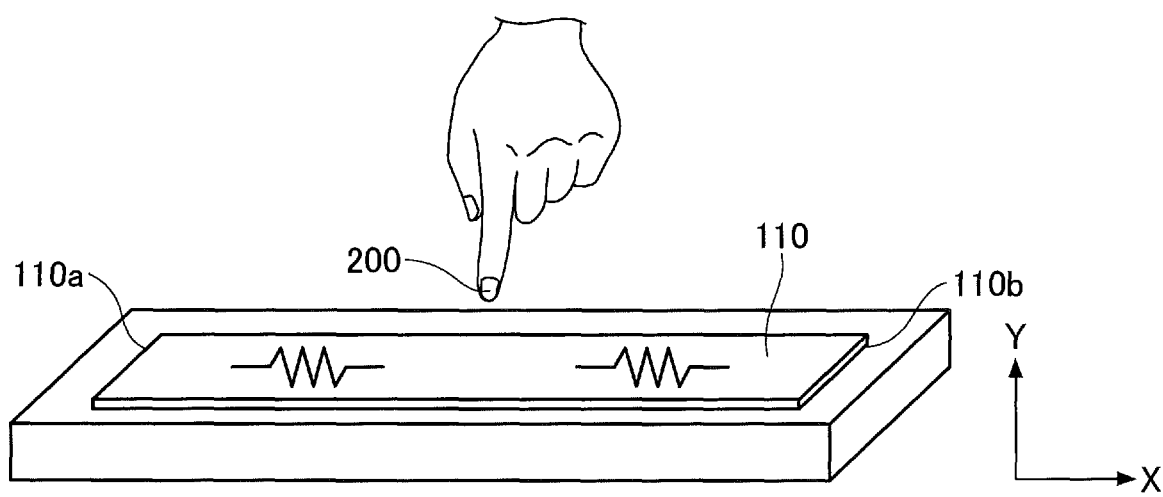
FIG. 10A is an explanation view (3) of an operation input device according to a second embodiment.
Figure 10B:
FIG. 10B is an explanation view (4) of an operation input device according to a second embodiment.
Figure 11A:
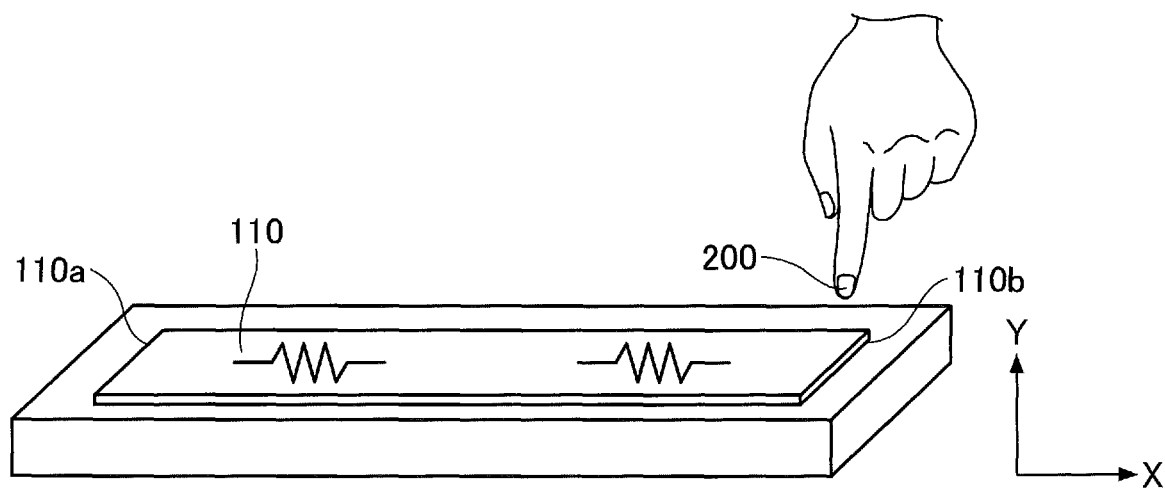
FIG. 11A is an explanation view (5) of an operation input device according to a second embodiment.
Figure 11B:
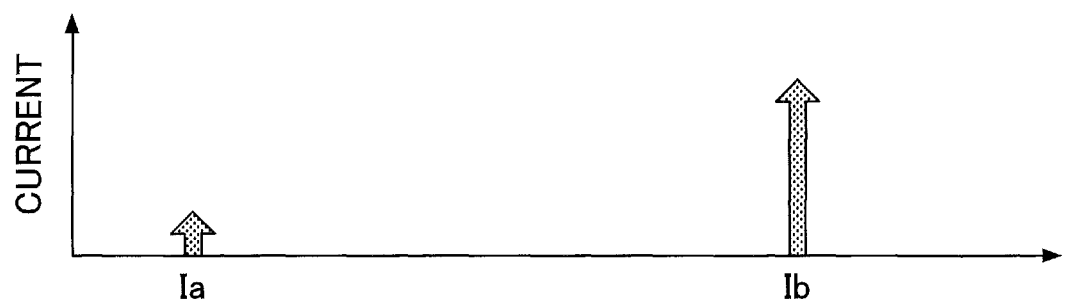
FIG. 11B is an explanation view (6) of an operation input device according to a second embodiment.

Specifically, when the finger 200 is present in the vicinity of one end 110a of the sensor 110 as shown in FIG. 9A, the alternating current Ia flows more than the alternating current Ib, as shown in FIG. 9B. In addition, as shown in FIG. 10A, when the finger 200 is present in the vicinity of the middle between one end 110a of the sensor 110 and the other end 110b, the alternating current Ia and the alternating current Ib are substantially the same as each other, as shown in FIG. 10B. Also, as shown in FIG. 11A, when the finger 200 is present in the vicinity of the other end 110b of the sensor 110, the alternating current Ib flows more than the alternating current Ia, as shown in FIG. 11B. Therefore, based on the ratio of the alternating current Ia to the alternating current Ib, the distance X in the X direction from one end 110a to the finger 200 of the sensor 110 can be calculated.

Figure 12A:
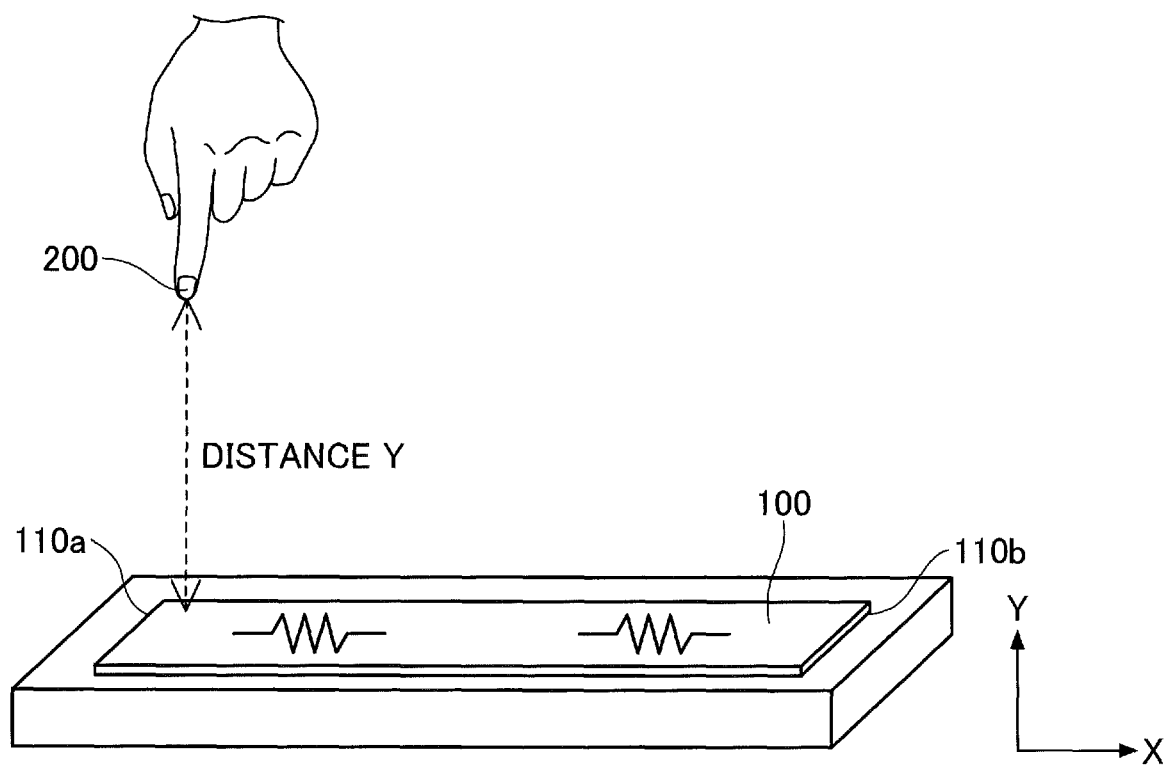
FIG. 12A is an explanation view (7) of an operation input device according to a second embodiment.
Figure 12B:
FIG. 12B is an explanation view (8) of an operation input device according to a second embodiment.

In the meantime, even if the finger 200 is present in the vicinity of one end 110a of the sensor 110, when the distance Y between the sensor 110 and the finger 200 is long, as shown in FIG. 12A, the values of the alternating current Ia and the alternating current Ib are both low, and the ratio between the alternating current Ia and the alternating current Ib is different from the state as shown in FIG. 9A. Therefore, the precise position of the finger 200 in the X direction cannot be detected. Specifically, as shown in FIGS. 9A to 11B, when the sensor 110 and the finger 200 are close to each other, the distance X from one end 110a to the finger 200 can be accurately calculated from the value of Ib/Is without considering the distance Y. However, when the finger 200 is far from the sensor 110, because the ratio between the alternating current Ia and the alternating current Ib is different from the case where the sensor 110 and the finger 200 are close to each other, the precise distance X from one end 110a cannot be obtained.

Figure 13:
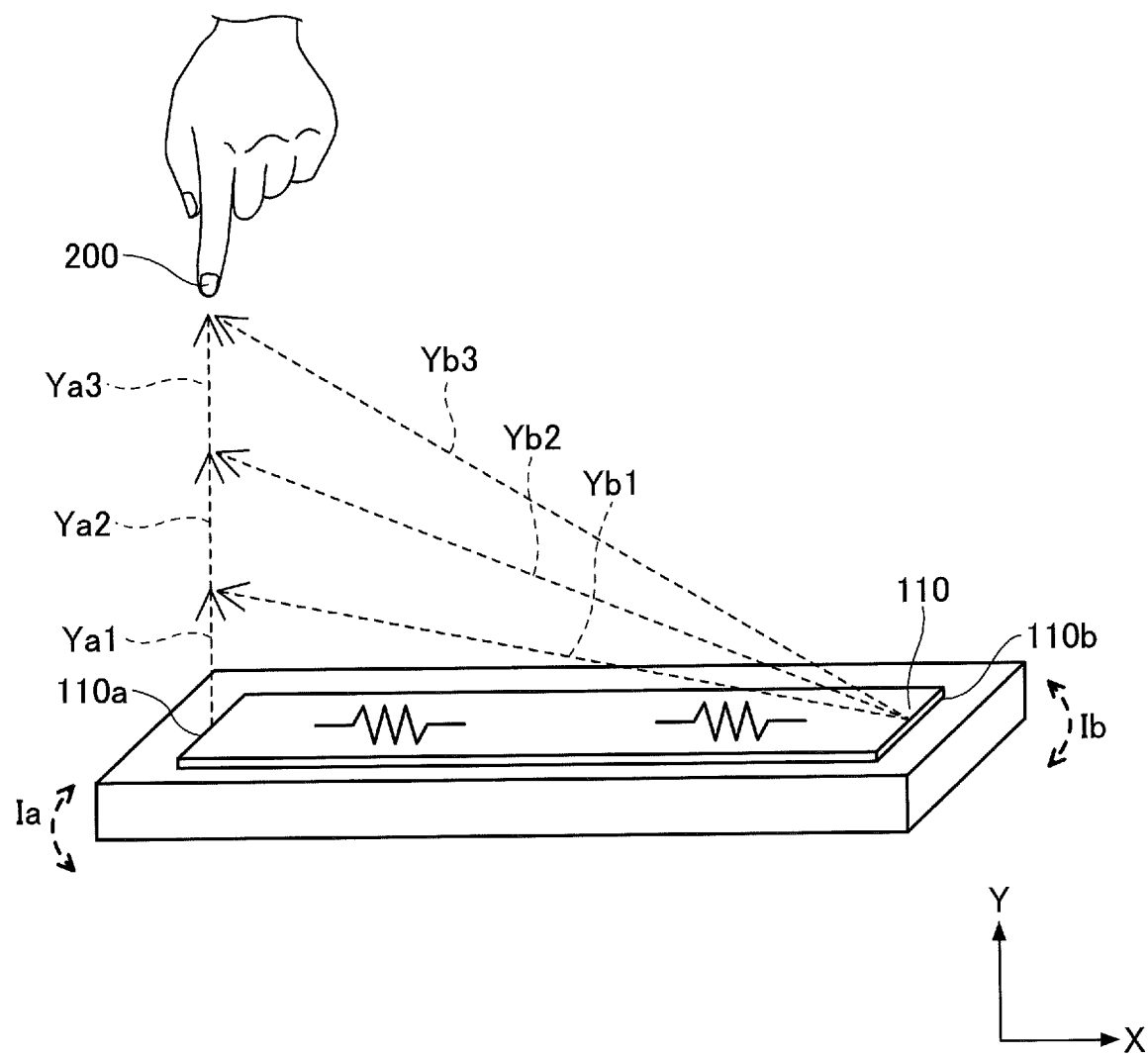
FIG. 13 is an explanation view (9) of an operation input device according to a second embodiment.

For example, as shown in FIG. 13, the case is considered where finger 200 is moved in the Y direction at a position directly above one end 110a of the sensor 110. In this case, when the distance from one end 110a to the finger 200 of the sensor 110 is made a distance Ya, and when the distance from the other end 110b to the finger 200 of the sensor 110 is made a distance Yb, the distances have the relationship of $Yb = \{L^2 + (Ya)^2\}^{1/2}$.

Therefore, when a distance Ya1 from one end 110a to the finger 200 of the sensor 110 is relatively close, because the difference between a distance Yb1 from the other end 110b to the finger 200 of the sensor 110 and the distance Ya1 is great, the ratio between the alternating current Ia and the alternating current Ib is great. As the finger 200 gets away from the sensor 110, the distance Ya2 from one end 110a to the finger 200 of the sensor 110 is lengthened; the difference between the distance Yb2 from the other end 110b to the finger 200 of the sensor 110 and the distance Ya2 is gradually decreased; and the ratio between the alternating current Ia and the alternating current Ib is gradually decreased. When the finger 200 farther gets away from the sensor 110, the difference between the distance Yb3 from the other end 110b of the sensor 110 to the finger 200 and the distance Ya3 is further decreased, and the ratio between the alternating current Ia and the alternating current Ib is further decreased.

That is, when the distance Ya is small, because the ratio between the distance Ya and the distance Yb is close to the ratio between the distances between the projection position of the finger to the sensor surface from the ends 110a and 110b of the sensor 110, the alternating currents Ia and Ib flow corresponding to the distances (the resistance value), and a relatively accurate distance X can be obtained from the value of Ib/Is. However, when the finger 200 much farther gets away from the sensor 110 and the distance Ya from the finger 200 increases, the influence of the three-dimensional distribution of the capacitance component increases, and the error between the value of the distance X obtained from the value of Ib/Is and the actual distance X increases.

Figure 14:
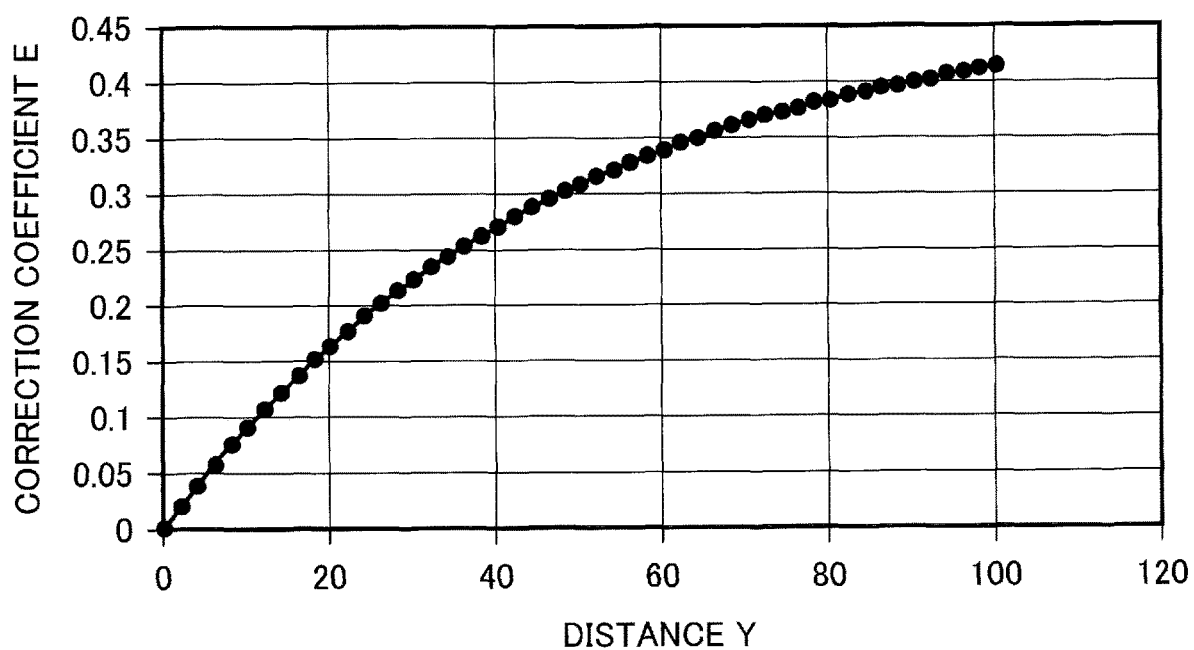
FIG. 14 is a correlation diagram between a distance Y from a sensor and a correction factor E.

For this reason, in the present embodiment, a correction coefficient E corresponding to the value of the distance Y is introduced, and correction is performed for the position of the finger 200 in the X direction. Specifically, the relationship between the distance Y and the correction coefficient E is shown in FIG. 14. That is, the correction coefficient E based on the ratio of the distance Ya and the distance Yb between the finger and the electrode is introduced for the correction, and the correction is performed for the position of fingers in the X direction. FIG. 14 is an example of a correction coefficient according to a distance Y. The correction coefficient E is calculated from the value of Ya/(Ya+Yb) with respect to the distance Ya, which is the correction value when L=100 is set. On this occasion, as shown in FIG. 13, the distance Ya and the distance Yb are obtained at a position where the finger 200 is located directly above the end (where the electrode is present) of the sensor 110.

(Method for Detecting Position of Finger by Operation Input Device)

Figure 15:
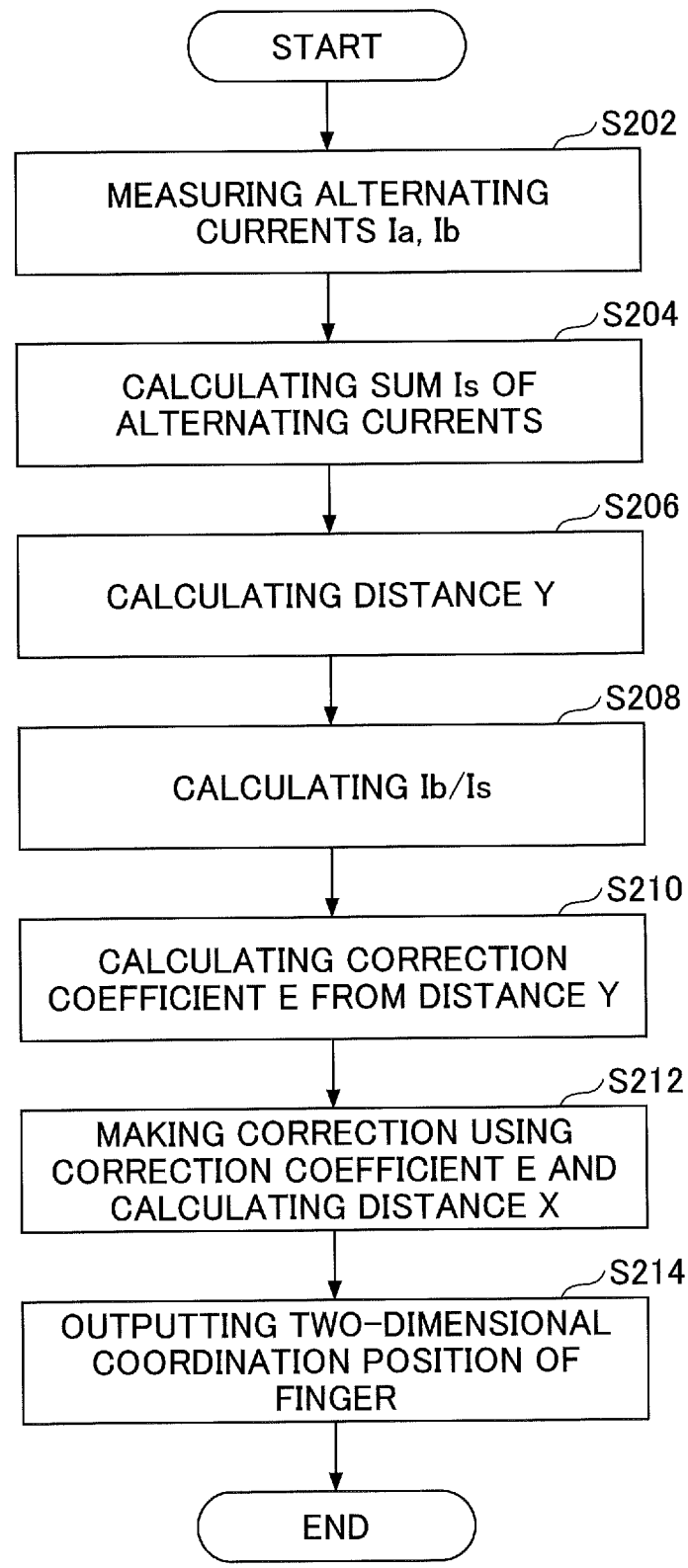
FIG. 15 is a flowchart of position detection by an operation input device according to a second embodiment.

Next, a method for detecting a position of a finger by the operation input device according to the present embodiment will be described with reference to FIG. 15. In addition, it is assumed that the controller 150 stores the equation shown in Formula 1, the information on the correlation between the distance Y between the sensor 110 and the finger 200 and the sum of alternating currents Is, the information on the relationship between the distance Y and the correction coefficient E shown in FIG. 14, and the like in advance. Further, the control of the detection method according to the present embodiment is performed by the controller 150.

First, in step 202 (S202), the alternating currents Ia, Ib are measured. Specifically, the alternating current Ia is measured by the first current meter 121, and the alternating current Ib is measured by the second current meter 122.

Next, in step 204 (S204), the sum of the alternating currents Is (=Ia+Ib) is calculated from the alternating current Ia and the alternating current Ib.

Next, in step 206 (S206), the distance Y from the sensor 110 to the finger 200 is calculated from the sum of the alternating currents Is.

Next, in step 208 (S208), Ib/Is is calculated. Specifically, the Ib/Is is calculated by dividing the alternating current Ib by the sum of the alternating currents Is. In the present embodiment, the Ib/Is may be expressed as DX.

Next, in step 210 (S210), the correction coefficient E is calculated from the distance Y. Specifically, from the distance Y obtained in step 206, the correction coefficient E is calculated based on the relationship between the distance Y and the correction coefficient E as shown in FIG. 14 stored in the controller 150.

Next, in step 212 (S212), the distance X is calculated based on the correction coefficient E obtained in step 210. Specifically, the distance X from one end 110a of the sensor 110 is calculated by calculating the position index D from the equation shown in Formula 2 below and multiplying the length L by the position index D. The position index D represents the ratio of the distance X from one end 110a of the sensor 110 to the length L of the sensor 110 (the length between one end 110a and the other end 110b of the sensor 110). Formula 2 is an example of calculating the position index D, and the position index D is calculated by correcting the magnitude of the difference between the sensor center (position index 0.5) where the distance from both ends of the sensor 110 becomes equal and the actual measured position index DX while using the correction coefficient E.

$$D = 0.5 - \frac{(0.5 - DX) \times 0.5}{(0.5 - E)}$$ [Formula 2]

Next, in step 214 (S214), the two-dimensional coordinate position of finger 200 is output. The distance X and the distance Y at this two-dimensional coordinate position are coordinate positions when one end 110a of the sensor 110 is made a reference.

Thus, the two-dimensional position of the finger 200 can be obtained by the operation input device according to the present embodiment.

Specifically, in steps S210 and S212, the position of the finger 200 in the direction parallel to the plane of the sensor 110 is detected by correcting the value (Ib/Is) of the alternating current Ib with respect to the sum of the alternating currents Is obtained from the alternating current Ia and the alternating current Ib based on the ratio between the distance Ya from one end 110a of the sensor 110 to the finger 200 that is an operating medium and the distance Yb from the other end 110b of the sensor 110 to the finger.

By repeating the detection of the two-dimensional position of the finger 200 in the above procedure, the trajectory of finger 200 can be detected, and the gesture detection of the finger can be performed. This allows a gesture input of the finger 200.

Figure 16:
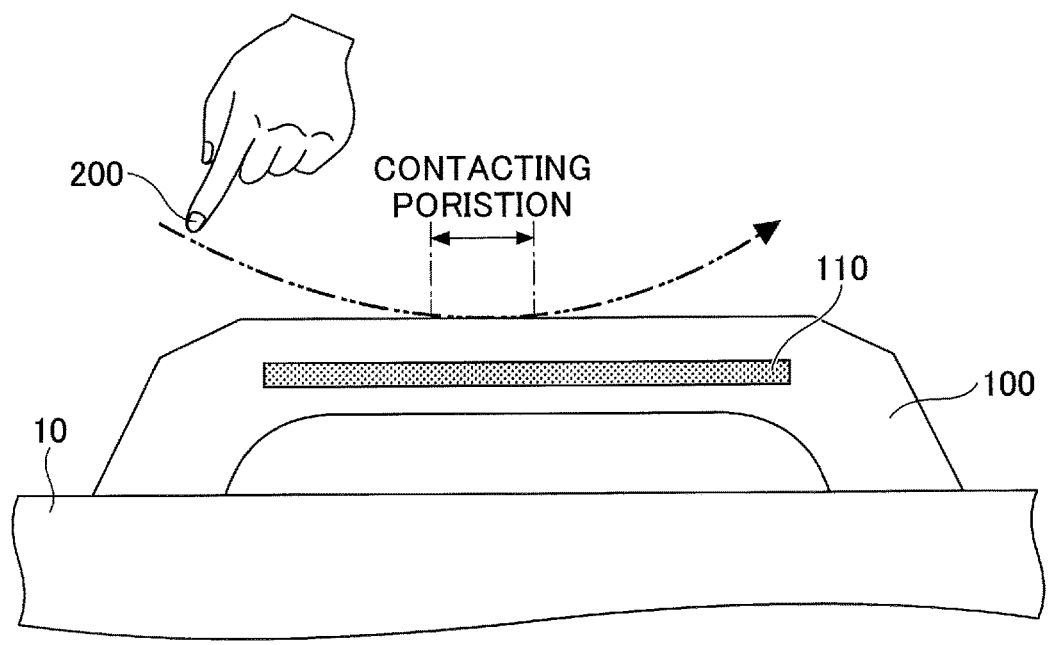
FIG. 16 is an explanatory view of an operation input method of an operation input device according to a second embodiment.

In the resent embodiment, as shown in FIG. 16, even when the portion of the door handle 100 in which the finger 200 is in contact is narrow, the trajectory of the finger 200 can be accurately detected, thereby allowing a gesture input by the finger 200.

Because the operation input device according to the present embodiment can detect a movement of the finger 200 in two dimensions, various gesture inputs can be performed.

The descriptions other than the above are the same as those of the first embodiment.

Third Embodiment

Figure 17:
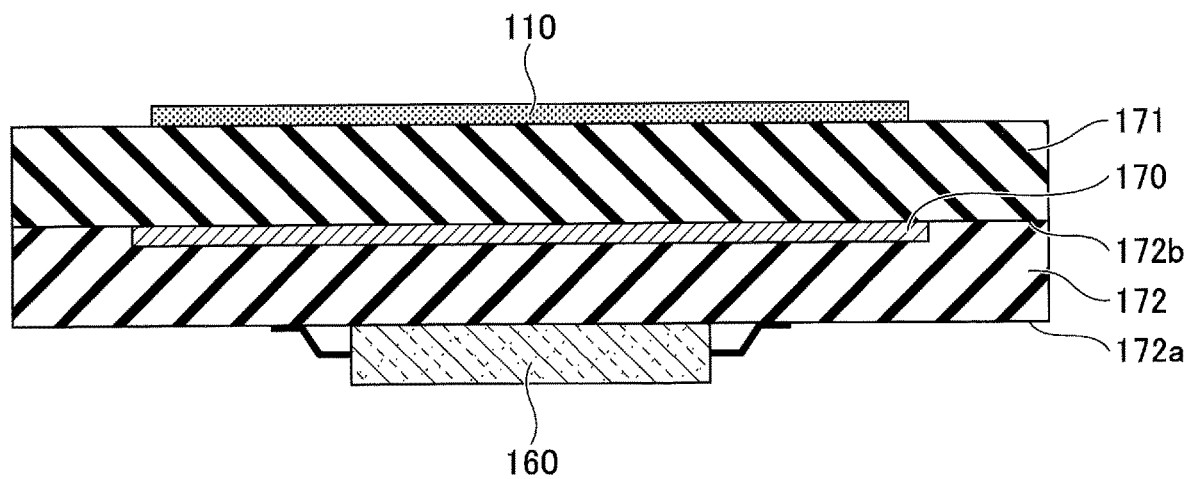
FIG. 17 is a structural diagram of an operation input device according to a third embodiment.

Next, a third embodiment will be described. In the present embodiment, an integrated circuit 160 is mounted on the back side of the sensor 110 as shown in FIG. 17, and a shield electrode 170 is provided between the sensor 110 and the integrated circuit 160. An insulating layer 171 is formed between the sensor 110 and the shield electrode 170, and the integrated circuit 160 is mounted on one surface 172a of the substrate 172 formed of an insulator, and the shield electrode 170 is formed on the other surface 172b of the substrate 172. The integrated circuit 160 includes an electronic circuit used for detection in the sensor 110 in addition to the controller 150 and the like.

In the present embodiment, an alternating current having the same phase and the same amplitude of voltage as alternating currents supplied from the first AC power source 131 and the second AC power source is supplied to the shield electrode 170. This can reduce the influence of a noise from the back side of the sensor 110 and can increase the dynamic range, thereby improving the sensitivity of the sensor 110.

The descriptions other than the above are the same as those of the first and second embodiments.

In the embodiment, the case where the AC power source is connected to the end of the sensor that is substantially at the end of the substrate has been described, but it may be connected to an intermediate location of the sensor. In such a case, the connection location corresponds to the end of the sensor in the embodiment described above.

As described above, according to the disclosed operation input device of the embodiments, the operation input device has a simple structure, and can input a variety of pieces of operation information without significantly limiting a range of operation.

The embodiments have been described in detail above, but are not limited to any particular embodiment, and various modifications and variations can be made within the scope of the appended claims.

What is claimed is:

1. An operation, input device, comprising:
   a resistance, element that generates a capacitance between an operating medium and the resistance element in response to, an approach of the operating medium to the resistance element;
   a power source that supplies electric charge to one end and another end of the resistance element;
   a first electric charge amount measuring unit that measures a first electric charge transfer amount supplied to the one end of the resistance element in response to generation of the capacitance;
   a second electric charge amount measuring unit that measures a second electric charge transfer amount supplied to the another end of the resistance element in response to the generation of the capacitance; and
   a controller connected to the first electric charge amount measuring unit and the second electric charge amount measuring unit and that detects, based on a sum of the first and second electric charge transfer amounts, a first position of the operating medium, wherein the first position is defined in a direction perpendicular to a surface of the resistance element.

2. The operation input device as claimed in claim 1, the controller detects a second position of the operating medium in a direction parallel to the surface of the resistance element based on a first value of the first electric charge transfer amount with respect to the sum of the first and second electric charge transfer amounts or on a second value of the second electric charge transfer amount with respect to the sum of the first and second electric charge transfer amounts.

3. The operation input device as claimed in claim 2, wherein the controller calculates the first position of the operating medium in the direction perpendicular to the surface of the resistance element by performing correction based on the second position of the operating medium in the direction parallel to the surface of the resistance element for the first value of the first electric charge transfer amount with respect to, the sum of the first and second electric charge transfer amounts or the second value of the second electric charge transfer amount with respect to the sum of the first and second electric charge transfer amounts.

4. The operation input device as claimed in claim 1, wherein the controller detects the second position of the operating medium in the direction parallel to the surface of the resistance element by correcting a value of the second electric charge transfer amount with respect to the sum of the first and second electric charge transfer amounts based on a ratio between a first distance from the one end of the resistance element to the operating medium and a second distance from the another end of the resistance element to the operating medium.

5. The operation input device as claimed in claim 1, wherein the power source applies alternating-current voltages having approximately a same amplitude of voltage and a same phase, to the one end and the another end of the resistance element.

6. The operation input device as claimed in claim 1, further comprising: a shield electrode provided between the resistance element and the controller.

7. A door handle, comprising: a door handle member; and an operation input device as claimed in claim 1.

8. A method of detecting a position of an operating medium, comprising:
   generating, with a resistance element, a capacitance between the operating medium and the resistance element in response to an approach of the operating medium to the resistance element;
   supplying, with a power source, electric charge to one end and another end of the resistance element;
   measuring, with a first electric charge amount measuring unit, a first electric charge transfer amount supplied to the one end of the resistance element in response to generation of the capacitance;
   measuring, with a second electric charge amount measuring unit, a second electric charge transfer amount supplied to the another end of the resistance element in response to the generation of the capacitance; and
   detecting, with a controller, based on a sum of the first and second electric charge transfer amounts, a first position of the operating medium, wherein the first position is defined in a direction perpendicular to a surface of the resistance element.

* * * * *